United States Patent [19]

Washburn, Jr.

[11] Patent Number: 4,731,872
[45] Date of Patent: Mar. 15, 1988

[54] FM TVRO RECEIVER WITH IMPROVED OSCILLATING LIMITER

[75] Inventor: Clyde Washburn, Jr., Cincinnati, Ohio

[73] Assignee: Cincinnati Microwave, Inc., Cincinnati, Ohio

[21] Appl. No.: 827,327

[22] Filed: Feb. 7, 1986

Related U.S. Application Data

[63] Continuation-in-part of Ser. No. 717,250, Mar. 25, 1985, Pat. No. 4,679,247.

[51] Int. Cl.$^4$ .......................... H04B 1/16; H03D 3/24
[52] U.S. Cl. .................................. 455/210; 329/134; 329/136
[58] Field of Search ............... 455/210, 211, 308, 309; 329/131–134, 136

[56] References Cited

U.S. PATENT DOCUMENTS

| | | |
|---|---|---|
| 2,086,566 | 7/1937 | McCaa . |
| 2,388,200 | 10/1945 | Wilmotte . |
| 2,401,214 | 5/1946 | Worcester, Jr. . |
| 2,438,501 | 3/1948 | Hings . |
| 2,525,151 | 10/1950 | Stenning . |
| 2,617,019 | 11/1952 | Hepp . |
| 2,687,476 | 8/1954 | Guanella . |
| 2,927,997 | 3/1960 | Day . |
| 2,969,459 | 1/1961 | Hern . |
| 3,193,771 | 7/1965 | Boatwright . |
| 3,217,237 | 11/1965 | Boatwright . |
| 3,320,544 | 5/1967 | Deman . |
| 3,531,731 | 9/1970 | Matsuura et al. . |
| 3,611,169 | 10/1971 | Hess et al. . |
| 3,792,357 | 2/1974 | Hekimian et al. . |
| 3,832,638 | 8/1974 | Ohashi et al. .......................... 329/132 |
| 3,867,707 | 2/1975 | Pering et al. . |
| 3,909,725 | 9/1975 | Baghdady . |
| 3,911,366 | 10/1975 | Baghdady . |
| 4,035,730 | 7/1977 | Clayton . |
| 4,079,330 | 3/1978 | Ishigake et al. . |
| 4,101,837 | 7/1978 | Clayton, Jr. et al. . |
| 4,189,755 | 2/1980 | Balbes et al. . |
| 4,316,108 | 2/1982 | Rogers, Jr. . |
| 4,328,590 | 5/1982 | Lee . |
| 4,339,828 | 7/1982 | Chasek . |
| 4,408,350 | 10/1983 | Donath . |
| 4,584,596 | 4/1986 | Mobley . |
| 4,641,181 | 2/1987 | Mobley . |

OTHER PUBLICATIONS

CCIR Recommendation 567, Recommendations and Reports of the CCIR, 1982, XVth Plenary Assembly, Geneva, 1982, (International Telecommunication Union) and EIA Standard RS 250-B, pp. 30, 32.

E. J. Baghdady, Chapter Four, "The Theory of Feedback Around the Limiter".

A. W. Emmons, "The Employment of Feedback in Frequency Modulation Receivers to Reject Interference," S. M. Thesis, Dep't. of Electrical Engineering, M.I.T.; Jan. 1956.

J. B. Wiesner and E. J. Baghdady, "VIII, Multipath Transmission," pp. 42–49 of Quarterly Progress Report, Research Laboratory of Electronics, M.I.T.; Apr. 15, 1956.

E. J. Baghdady, "Theory of Feedback Around the Limiter," 1957, *IRE Natl. Convention Record*, pt. 8, pp. 176–202.

(List continued on next page.)

*Primary Examiner*—Robert L. Griffin
*Assistant Examiner*—Curtis Kuntz
*Attorney, Agent, or Firm*—Wood, Herron & Evans

[57] ABSTRACT

An improved FM receiver is disclosed incorporating improved oscillating limiter circuitry having an electrically tunable bandpass filter which is phase modulated by the baseband signal the phase of which has been advanced in accordance with the formula:

$$\phi_n = 360° \cdot \frac{td_1 + td_2 + td_3}{\frac{1}{f_n}}$$

wherein $td_1$ equals the time delay through the limiter, $td_2$ equals the time delay through the feedback filter, $td_3$ equals the time delay through the demodulator and $f_n$ equals the frequency of the respective baseband components.

27 Claims, 5 Drawing Figures

OTHER PUBLICATIONS

L. D. Shapiro, "Interference and Noise Rejection in F.M. Receivers," S. M. Thesis, Dept. of Electrical Engineering, M.I.T.; May 20, 1957.

R. J. McLaughlin, "A Study of FM Capture Effects," S. M. Thesis, Dept. of Electrical Engineering, M.I.T.; Jun. 1, 1958.

K. P. Luke, "The Locking and Interference Suppression Characteristics of an Oscillating Limiter," S. M. Thesis, Dept. of Electrical Engineering, M.I.T.; Sep. 5, 1958.

E. J. Baghdady, "FM Interference and Noise-Suppression Properties of the Oscillating Limiter," *IRE Trans. on Vehicular Transactions*, vol. VC-13, pp. 13-39; Sep., 1959.

E. J. Baghdady, "A Technique for Lowering the Noise Threshold of Conventional Frequency, Phase and Envelope Demodulators," *IRE Trans. on Communication Systems*, vol. CS-9, pp. 194-206; Sep., 1961.

E. J. Baghdady, "Dynamics of a Signal-Squelched Oscillating Limiter," *Proceedings of the IEEE*, pp. 492-493; Mar. 1963, (Correspondence).

E. J. Baghdady, "Noise Threshold Reduction with the Oscillating Limiter," *Proceedings of the IEEE, pp. 493-95; Mar., 1963, (Correspondence)*.

R. Y. Huang, "An Analysis of the Oscillating Limiter", *IEEE Trans. on Space Electronics and Telemetry*, vol. VSET-9, No. 3, pp. 67-70; Sep., 1963.

E. Bozzoni and U. Mengali, "Comparison Between the Oscillating Limiter and the First-Order Phase-Locked Loop," *Proceedings of the IEEE*, vol. 56, No. 11, p. 2094; Nov., 1963.

E. Bozzoni and U. Mengali, "A General Analysis of the Performance of the Oscillating Limiter with Noiseless Signals," *IEEE Trans. of Communication Technology*, vol. COM-14, No. 5, pp. 578-588; Oct. 1966.

E. Bozzoni and U. Mengali, "Experimental Verification of a Model of the Oscillating Limiter," *IEEE Trans. on Communication Technology*, vol. COM-15, No. 6, pp. 865-867; Dec., 1976.

E. Bozzoni and U. Mengali, "An Analysis of the Performance of the Oscillating Limiter Driven by FM Signals Corrupted by Noise," *IEEE Trans. on Aerospace and Electronic Systems*, vol. AES-5, No. 3, pp. 537-547; May, 1969.

E. Bozzoni and U. Mengali, "Correction to 'An Analysis of the Performance of the Oscillating Limiter Driven by FM Signals Corrupted by Noise'," *IEEE Trans. on Aerospace and Electronic Systems;* Nov., 1969, (Correspondence).

Scientific Atlanta Receiver, Series 6600, Video Demodulator Circuit.

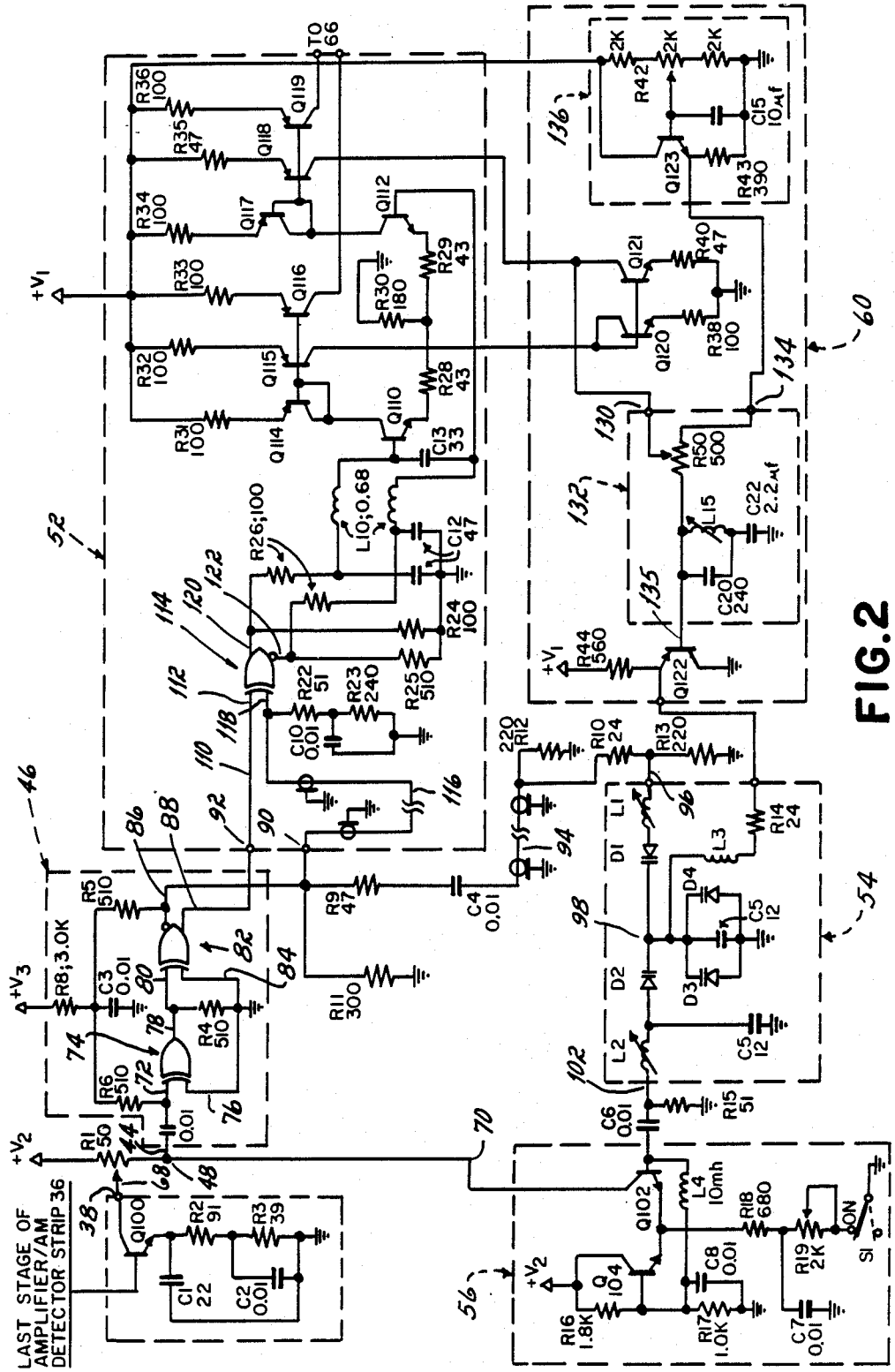

4,731,872

FM TVRO RECEIVER WITH IMPROVED OSCILLATING LIMITER

RELATED APPLICATIONS

This application is a continuation-in-part of my earlier application Ser. No. 717,250, filed Mar. 27, 1985, now U.S. Pat. No. 4,679,247 entitled "Improved FM Receiver".

BACKGROUND OF THE INVENTION

This invention relates to FM receivers, and particularly to FM receivers adapted to receive weak signals in the presence of noise such as encountered in reception of television signals transmitted via satellite. Specifically, the present invention relates to receivers for satellite transmitted television signals, i.e., television receive only (TVRO) receiver utilizing noise threshold extension circuitry of the oscillating limiter type.

Information signals such as television signals having a variety of frequency components may be frequency or angle modulated onto a carrier signal of predetermined frequency. A typical television signal includes among other information, a color burst or chroma signal at a frequency of about 3.58 MHz, and may further include audio subcarriers in a range of frequencies between approximately 5.4 MHz and approximately 8.5 MHz. The resulting frequency modulated (FM) signal is of a predetermined bandwidth centered about the frequency of the carrier signal. The FM signal may be transmitted from an earth-bound transmitter to an orbiting satellite and subsequently retransmitted from the satellite to earth receiving stations. The earth receiving station might normally include a reflector antenna configured to receive the satellite signal. The reflector antenna is typically coupled to a low noise amplifier which is further coupled to a receiver such as a FM TVRO receiver. The FM TVRO receiver is designed to demodulate the television signal from the carrier signal. To that end, the FM receiver will typically include circuitry to heterodyne, super-heterodyne, or otherwise mix the signal received at the antenna dish with one or more local oscillator signals to produce an intermediate frequency (IF) FM signal which can more easily be operated upon by conventional receiver circuitry. The IF signal is still an FM signal, albeit at a lower frequency as is well understood. That is, the FM signal transmitted by the satellite may have a certain carrier frequency in the several gigahertz range whereas, in television satellite communication systems, the IF signal may typically be centered about 70 MHz with a bandwidth of approximately 30 MHz, i.e., about 55 MHz to 85 MHz.

The IF signal is subsequently coupled to a demodulator or detector where it is demodulated to reproduce as nearly as possible the original modulating or baseband signal. This resultant demodulated, or baseband, signal is provided to a television monitor for viewing, or may be further process as desired.

In a television satellite transmission system, the baseband signal is, ideally, 0 to 8.5 MHz and includes the video, audio subcarrier and related information signals only. Within the baseband, the continuous video region from below about 30 Hz to about 4.2 MHz is of primary interest in the demodulation of 525 line television formats, such as NTSC, whereas for 625 line television format, such as PAL, the continuous video region of primary interest is from below about 25 Hz to about 5.0 MHz. The region lying between the upper end of the video baseband (about 4.2 MHz or about 5.0 MHz) to the typical baseband upper limit of about 8.5 MHz is normally used for the transmission of relatively narrow band FM subcarriers, a common format having the same transmission parameters as broadcast FM transmissions. These subcarriers are normally detected by suitable narrow band detectors, and because of the reduced bandwidth typically associated therewith, are more resistant to the effects of noise. Wideband subcarriers may also be encountered.

In reality, due to the nature of the satellite communication system involved, the FM signal appearing at the input to the receiver of the earth receiving station is typically extremely weak and accompanied by a substantial amount of electrical noise. This condition is caused, in part, by the fact the signal transmitted by the satellite transmitter must travel a great distance to reach the earth-bound receiver. As a result, the strength of the information portion of the signal received may be so weak as to not be intelligible after demodulation. Compounding the difficulty of receiving such weak signals is the unavoidable addition of terrestrial noise to the signal due to objects with non-zero temperature in the view of the reflector antenna. Objects with non-zero noise temperature are sources of electrical noise which can be received by the reflector antenna. In addition to the terrestrial noise, a variety of other unavoidable electrical noise sources are commonly encountered in typical communication systems, as well as in satellite communication systems. The net effect is that the receiver must extract an extremely weak information signal in the presence of strong noise if satisfactory results are to be achieved. The foregoing, and the essentially triangular spectral distribution of noise in the baseband, result in a baseband or demodulated signal which is not a true reproduction of the original television signal but will likely also contain a great deal of noise, i.e., spurious signals. Such noise can degrade picture quality and/or audio fidelity and may even preclude detection of the information content of the signal.

As mentioned, an FM signal has a center frequency which is the carrier frequency. Ideally, the frequency of the FM signal will thus vary about the center or carrier frequency but the amplitude of the signal will not vary. Hence, it can be assumed that amplitude variations (AM) on the received signal are noise. To eliminate such AM noise, it is common practice to employ an amplitude limiter between the IF stage of the receiver and the subsequent demodulator stage. The amplitude limiter operates to limit amplitude variations appearing on the FM signal as appears from the IF stage thus reducing the AM noise therein, and preventing its conversion to the baseband output by detector imperfections.

Where the strength of the information signal received is large compared to the noise in the signal, an amplitude limiter alone will usually suffice to sufficiently suppress the AM noise. However, where the information signal strength is weak compared to the noise, reduction of the AM noise by the amplitude limiter will be insufficient for quality picture reception and/or may adversely affect the weak information signal precluding proper demodulation.

As a measure of information or the ratio of modulation information to noise, it is typical to determine the carrier-to-noise ratio, or CNR. In terms of CNR, about at 12 to 14 dB and higher, the amplitude limiter is alone sufficient to suppress AM noise. On the other hand, at CNR levels below about 12 dB the limiter's capability is usually not adequate to properly suppress the noise without also affecting the information signal.

As recognized in U.S. Pat. No. 3,909,725 to Baghdady, at such low CNR, the amplitude limiter's performance can be greatly improved by providing regenerative (i.e., in-phase) feedback around the amplitude limiter. Regenerative feedback results in improved reception by suppressing the noise without degradation of the information signal. Thus, in U.S. Pat. No. 3,909,725, which is incorporated herein by reference, there is disclosed a feedback amplifier and filter configured to provide in-phase feedback around the limiter in the frequency band of interest. The filter is typically a bandpass filter with a bandpass wide enough to pass the entire FM signal containing the modulating signal. Such regenerative feedback permits better reception of weaker information signals in the presence of noise, and, subsequently, more satisfactory demodulation for viewing purposes, than previously possible. Hence, the lower limit or threshold of CNR at which proper reception can occur is extended. This phenomenon or technique is sometimes, therefore, referred to as threshold extension.

When regenerative feedback around the limiter is employed, the circuit will normally tend to oscillate in the absence of an input signal. Hence, a limiter having regenerative feedback is often referred to as an oscillating limiter. This self-induced oscillation has the added benefit of providing a squelch to the receiver as described in the aforesaid Baghdady patent.

The Baghdady oscillating limiter concept appears to substantially lower the CNR threshold at which proper demodulation can occur, however, its boundary conditions for proper operation are exceeded under many satellite television modulation conditions. Subsequent developments with oscillating limiters have attempted to further extend the boundary conditions by providing for electrical tuning of the feedback filter, referred to as an electrically tunable bandpass filter. Thus, in U.S. Pat. Nos. 4,035,730 and 4,101,837, the feedback filter is an electrically tunable bandpass filter with a bandwidth apparently narrower than the IF bandwidth and having a center frequency nominally set at the IF center frequency (e.g., 70 MHz). These two patents have apparently proceeded on the assumption that the boundary would be further extended by tuning or "steering" the center frequency of the filter so that it tracks or matches the frequency of the FM input while trying to cause the tuning to ignore the noise in the signal. The patents describe steering as follows: the FM signal is demodulated to provide a baseband signal (and noise); the baseband signal is then filtered such that the high frequency or noise components are cut off and the filtered signal coupled to the feedback filter in an effort to cause the center frequency of the feedback filter to substantially match the frequency of the received IF FM signal; specifically, the steering is to apparently be done with at least the chroma (3.58 MHz) portion of the baseband signal but supplied to the feedback filter with zero phase relative to the limiter output. The latter patent, U.S. Pat. No. 4,101,837, emphasizes this point by describing the loop delay (between limiter output and filter control input for the steering signal) as desirably being 360°, i.e., substantially in-phase. If such attempts have worked at all, they have met with only marginal success in raising the boundary modulation conditions at which the oscillating limiter will improve reception. Moreover, an oscillating limiter which uses a feedback filter having a bandwidth less than the bandwidth of the FM signal wherein the center frequency is steered in response to the modulation of the FM signal apparently also interferes with proper demodulation at high CNR. Hence, in one prior art unit, the feedback filter is electronically decoupled from the limiter at CNR greater than about 12 dB CNR. Accordingly, such attempts to steer the filter may even result in poorer quality reception rather than improved reception.

Additionally, with the advent of satellite communications, a further problem has been encountered. Ideally, each satellite transponder which is set to a particular channel will operate at the same nominal or carrier frequency. That ideal is not always achieved. Hence, the signal to be received from one satellite may be at the correct nominal frequency whereas the signal to be received from a second satellite may be offset slightly in frequency due to drift or the like. Additionally, the receiving system may operate with some unwanted frequency offset of its own due to changes caused by temperature fluctuation such as in equipment mounted at the reflector antenna.

SUMMARY OF THE INVENTION

I have discovered that efforts to steer or tune the feedback filter are unnecessary. Indeed, as indicated in the Baghdady patent, the feedback filter should be as wide as the bandwidth of the FM signal (e.g., the IF bandwidth). Hence, steering is generally unnecessary and may well be futile. Further, such steering apparently degrades receiver performance, at least at high CNR, requiring circuitry to effectively remove the feedback at high CNR. However, in order to effectively utilize the noise reduction characteristics of the oscillating limiter, I have discovered that by operating the electrically tunable feedback filter as a phase modulator, further reduction in threshold is achieved and circuitry to eliminate or control the amount of feedback around the limiter is eliminated. Specifically, I have determined that the so-called steering signal should not have zero degrees have relative phase as taught by the U.S. Pat. Nos. 4,035,730 and 4,101,837; such relative phasing is always non-optimal. Instead, I have determined that if the components of the demodulated signal are each phase-advanced in accordance with specified criteria, and then applied to the feedback filter, substantial improvement is obtained without steering the filter and without the need to provide circuitry to filter or modify the noise in the baseband. Such advancing phase at 3.58 MHz for a television signal, for example, is 45° and hence, the steering signal applied to the filter is not at zero phase relative to the limiter output.

With appropriate advanced phase to the steering signal, the present invention provides an FM receiver with improved reception, particularly when used to receive weak information signals accompanied by substantial electrical noise. The present invention further provides, in an FM receiver having an oscillating limiter circuit which is useful in satellite television ground receiving stations, enhanced picture quality and/or sound reproduction of a television signal. The present invention also provides an FM receiver which can satisfactorily demodulate signals from a satellite transponder even though it is not operating at precisely its correct nominal frequency. Further, the present invention provides an FM receiver which can automatically compensate for undesired frequency offsets in the receiving system. Thus, the present invention represents an improvement of the Baghdady oscillating limiter which is superior to other attempted improvements.

Thus, in accordance with the present invention and in its broadest aspect, the oscillating limiter includes a feedback filter which phase modulates the limiter output signal with the demodulated signal wherein each frequency component of the demodulated signal has been phase advanced by an amount $\phi_n$ which is approximately equal to $$360° \cdot \frac{td_1 + td_2 + td_3}{\frac{1}{f_n}},$$

wherein $td_1$ equals the time delay through the limiter, $td_2$ equals the time delay through the feedback filter, $td_3$ equals the time delay through the demodulator and $f_n$ equals the frequency of the respective baseband components. In a specific embodiment adapted for color television, the major baseband component of concern is approximately 3.58 MHz. In a preferred system, the approximate time delays are $td_1 = 2$ nsec; $td_2 = 19$ nsec and $td_3 = 13$ nsec. Hence, the phase lead added, $\phi_n$, is approximately 45° for the 3.58 MHz signal.

To compensate for offset, drift and the like, the center frequency of the electrically tunable bandpass filter is tunable in response to a DC component in the detected video or baseband thereby causing the center frequency of the filter track the average frequency of the received signal over a substantial period of time.

Presently, practical feedback networks are unable to provide both the correct amplitude and phase simultaneously at the chroma and all subcarrier frequencies. Future circuitry may allow such simultaneous optimization, and it should be considered to be within the scope and spirit of my invention. Without such proper phasing across the entire band, I have discovered that some baseband signals are sufficiently handled by the Baghdady oscillating limiter without modification, yet such signals, if not properly phase advanced when supplied to the feedback filter, may significantly degrade performance of the oscillating limiter. In connection with a television signal, such problems may be presented by audio subcarriers. However, I have found that, because the chroma signal is the dominant signal of interest, the degrading effects of audio subcarrier power may be overcome merely by attenuating the subcarrier signals so that they do not contribute appreciably to the phase modulation of the electrically tunable bandpass filter.

By the foregoing, I have provided a noise reduction circuit for an FM receiver which extends the threshold by about 2 dB CNR and does not require additional special handling of noise nor control over the feedback dependent in any way on the CNR.

BRIEF DESCRIPTION OF THE DRAWINGS

These and other features and advantages of the invention will become more readily apparent from the following detailed description taken with the accompanying drawings in which:

FIG. 2 is a schematic drawing of a preferred limiter, feedback filter, demodulator and phasing circuit of FIG. 1;

DETAILED DESCRIPTION OF THE PREFERRED EMBODIMENT

Figure 1:
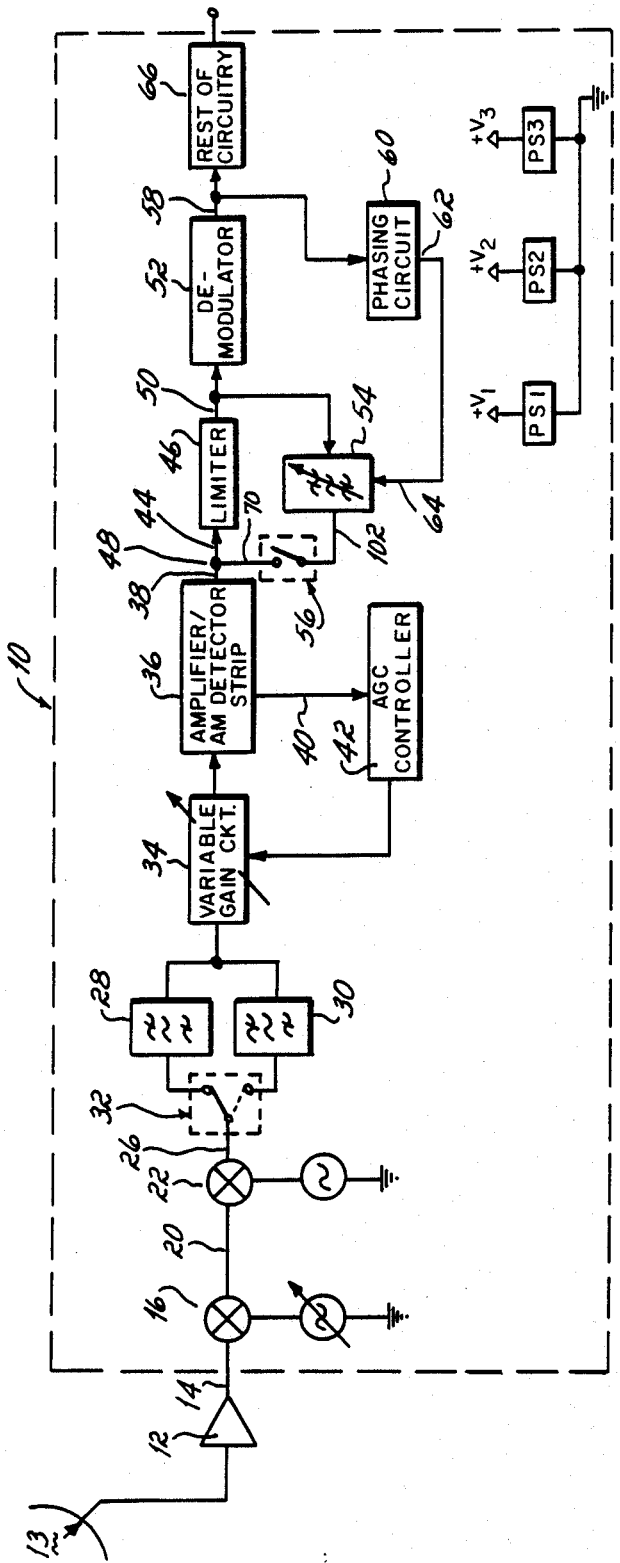
FIG. 1 is a block circuit diagram of a preferred embodiment of an FM receiver according to the present invention.

With reference to FIG. 1, there is shown a block circuit diagram of a preferred embodiment of an FM TVRO receiver 10 according to the present invention. Receiver 10 is driven by a low noise amplifier 12 which amplifies an FM signal received on reflector antenna 13. Reflector antenna 13 is sized to receive satellite transmitted television signals which are typically in the several gigahertz range. The output of low noise amplifier 12 is coupled to the input 14 of FM receiver 10.

As is conventional, the FM signal received on input 14 is mixed or heterodyned at first mixer 16 with a signal generated by a first local oscillator 18 to generate a first IF signal on output 20. The frequency of local oscillator 18 is variable so as to permit tuning of the receiver to the desired channel. The first IF signal on output 20 is preferably centered about 250 MHz. As is also conventional, the first IF signal is further mixed or heterodyned at second mixer 22 with the output of a second local oscillator 24 to produce a second IF signal preferably centered about 70 MHz on output 26. The second IF signal is an FM signal the modulation of which corresponds, ideally, to the original modulating signals, i.e., the television signals.

Output 26 is selectively coupled to a narrow bandwidth 4-pole IF filter 28 or a broader bandwidth 4-pole IF filter 30 by switch 32. IF filters 28, 30 are bandpass filters having a bandwidth of approximately 15.75 MHz and 30 MHz, respectively. For typical television signals in the United States, a 30 MHz bandwidth IF filter (30) is usually appropriate. In some instances, such as with the IntelSat European communication system, the bandwidth of the information signal is narrower. Thus, it is more appropriate to use the narrower bandwidth IF filter 28. In some situations with U.S. television systems, the terrestrial noise may be so great as to prevent satisfactory demodulation unless some of the noise is reduced. Hence, a very poor or no picture will result. Use of narrower IF filter 28 will also reduce some of that noise.

As seen in FIG. 1, receiver 10 is provided with a switch 32 which is preferably an electronic switch, as is well known, by which output 26 may be selectively coupled to either filter 28 or filter 30. When switch 30 is in a first position (shown in solid line in FIG. 1), the IF signal path includes narrow band IF filter 28. When switch 30 is in a second position (shown in dotted line in FIG. 1), the IF signal path includes wide band IF filter 30.

The outputs of IF filter 28, 30 are coupled to a variable gain circuit 34, the output of which is coupled to amplifier/AM detector strip 36. Amplifier/AM detector strip 36 is preferably comprised of three capacitively coupled SL1613C integrated circuits (not shown) manufactured by Plessey Solid State, Irvine, Calif., and an NPN transistor amplifier (Q100 in FIG. 2). Amplifier/AM detector strip 36 amplifies the IF signal and supplies the amplified IF signal on output 38 to the oscillating limiter of the invention to be discussed. Amplifier/AM detector strip 36 also provides an AM output 40 which drives an AGC controller 42 to vary the gain of circuit 34 to provide automatic gain control as is well understood.

The RF output of the last SL1613C integrated circuit (not shown) of amplifier/limiter strip 36 is coupled through NPN transistor amplifier Q100 thereof to provide an FM output 38 which is coupled to the input 44 of an amplitude limiter 46 at summing junction 48. The output 50 of limiter 46 drives demodulator or detector 52 to generate the baseband signals. Limiter output 50 is also regeneratively fed back via summing junction 48 to limiter input 44 through the series combination of electrically tunable bandpass filter 54 and electronic switch 56. Switch 56 is preferred but may be replaced with an electrically closed circuit (e.g., a short circuit or the like) if desired.

Demodulator 52 provides on its output 58 the baseband or modulating signal which, in a television system, includes the composite video (including chroma at about 3.58 MHz), audio subcarrier and related signals which are operated upon by the remaining FM receiver 10 circuitry as is well understood (represented by block 66). The circuitry of the present invention is also provided with a phasing circuit 60 which is responsive to the output 58 of demodulator 52. The output 62 of phasing circuit 60 comprises control signals which phase modulate filter 54 on the control input 64 thereof. Phasing circuit 60 also includes circuitry to average the baseband signal from detector 52 to provide a DC control signal on output 62 as well which DC control signal may be advantageously utilized to vary the center frequency of filter 54 to compensate for drift, offset, or the like affecting the IF center frequency.

The DC component is an integrated response to the varying frequency output from demodulator 52 and thus is proportional to the average frequency, i.e. the center frequency, of the IF signal. Filter 54 is tunable in response to this DC component whereby the center frequency of filter 54 corresponds to the center frequency of the IF signal corrected for frequency offsets as discussed above.

The feedback signal from output 50, which is coupled to input 44 through filter 54, is phase modulated by the control signals generated by circuit 60. As is well understood, all signals meet with some time delay as they pass through components of an electrical system. Limiter 46 generally presents a 2 nsec (nanosecond) time delay ($td_1$) whereas filter 54 presents an approximate 19.8 nsec delay ($td_2$) (inversely proportional to bandwidth). Similarly, detector 52 has a time delay associated therewith of approximately 13 nsec ($td_3$). I have determined that by phase modulating the feedback signal with the baseband signal, wherein each component of the baseband signal ($f_n$) is advanced in phase ($\phi_n$) by a particular amount, dramatic improvement over the prior art is obtained without added circuitry to compensate for the affects of the shaping circuit 60. $\phi_n$ is determined by summing the above three time delays, dividing by the inverse of the frequency component in question, and multiplying by 360°. Thus, $$\phi_n \text{ approximately equals } 360° \cdot \frac{td_1 + td_2 + td_3}{1/f_n}.$$

Hence, for example, with respect to the chroma signal (about 3.58 MHz), $\phi$ is approximately 45°, which has proved successful by experimentation.

FM receiver 10 also includes three power supplies PS1, PS2, and PS3 to provide a positive power supply of 12.0 volts, 6.0 volts and 5.2 volts, respectively. Power supplies PS1 through PS3 may be powered by a 120 volt AC line (not shown). The reference potential of all power supplies PS1 to PS3 are tied to the same point referred to herein as ground.

With reference to FIG. 2, there is shown a schematic diagram of limiter 46, demodulator 52, feedback filter 54, switch 56 and phasing circuit 60. Limiter 46, electrically tunable bandpass filter 54, and electronic switch 56 comprise an oscillating limiter in accordance with the principles of the present invention. The last stage of amplifier/AM detector strip 38 is an NPN transistor Q100, the collector of which is resistively coupled to summing junction 48 through wiper arm 68 of potentiometer R1. Potentiometer R1 also serves to provide DC power from power supply PS2 to the collector of transistor Q100 and to electronic switch 56. The emitter of transistor Q100 is coupled to ground through the parallel combination of capacitor C1 and series resistors R2, R3, the junction of which is bypassed to ground by capacitor C2.

Output 38 of transistor Q100 and output 70 of switch 56 are summed at junction 48 to drive input 44 of limiter 46. Input 44 is capacitively coupled to a first input 72 of exclusive OR gate 74 which is powered by power supply PS3. A second input 76 of gate 74 is coupled to ground. The output 78 of gate 74 is coupled to ground through resistor R4 and is further coupled to a first input 80 of exclusive OR/NOR 82 also powered by power supply PS3. A second input 84 of gate 82 is grounded.

Exclusive NOR output 86 and exclusive OR output 88 of gate 82 provide balanced limiter outputs which are coupled to inputs 90, 92 of double-balanced demodulator 52, respectively. Exclusive NOR output 86 is also coupled to input 72 of gate 74 through the series combination of resistor R5 and resistor R6. The junction of resistors R5 and R6 is coupled to ground by capacitor C3 and to power supply PS3 by resistor R8. The DC feedback provided by resistors R5 and R6 services to maintain operation of gates 74 and 82 in the approximate center of their transition region. Exclusive OR output 88 is also coupled to electrically tunable bandpass filter 54 through a series combination of resistor R9, capacitor C4, delay line (coaxial cable) 94 and resistor R10. The junction of output 88 and resistor R9 is resistively coupled to ground by resistor R11. Similarly, the junction of dely line 94 and resistor R10 is resistive coupled to ground via resistor R12. Finally, input 96 to electrically tunable bandpass filter 54 is coupled to ground through resistor R13.

Electrically tunable bandpass filter 54 includes the series connection of inductor L1, varactor diode D1, varactor diode D2, and inductor L2. The cathodes of varactor diodes D1 and D2 are connected in common at node 98. Connected in parallel between node 98 and ground is capacitor C5 and two varactor diodes D3 and D4. The cathodes of varactor diodes D3 and D4 are also connected in common at node 98. Varactor diodes D1 through D4 may be 1SV161 matched diodes available from Matcom, Inc., Palo Alto, Calif. Also coupled to node 98 is the output 62 of phasing circuit 60 through the series combination of inductor L3 and resistor R14 whereby filter 54 is responsive on a control input 64 to control signals generated by phasing circuit 55.

The output 102 of electrically tunable bandpass filter 54 is coupled to ground through resistor R15 and capacitively coupled by capacitor C6 to the base of NPN transistor Q102 which is part of switch 56. The collector of transistor Q102 is the output 70 of switch 56. Transistor Q102 is configured to operate like an electronic switch as will be discussed below.

The collector of transistor Q102 is biased by power supply PS2 through potentiometer R1. Similarly, the bases of transistors Q102 and Q104 are biased by a voltage divider comprised of resistors R16 and R17 in series from power supply PS2. the base of transistor Q102 is inductively coupled to the voltage divider by inductor L4. The emitters of NPN transistors Q102 and Q104 are connected together and are resistively coupled to ground through series resistor R18 and potentiometer R19 and switch S1. Also, the junction of resistor R18 and potentiometer R19 is capacitively coupled to ground through capacitor C7 while the junction of voltage divider resistors R16, R17 is further capacitively coupled to ground through capacitor C8.

By virtue of the foregoing arrangement, when switch S1 is in the closed position shown in FIG. 2, transistors Q102 and Q104 are biased into their active regions whereby signals from filter 54 can pass to summing junction 48 via transistor Q102. However, when switch 51 is in the open position (shown in dotted line in FIG. 2), transistors Q102 and Q104 are cutoff. Thus, no signal can pass from filter 54 to summing junction 48 thereby electronically disabling the oscillating limiter of the present invention.

As mentioned previously, limiter 46 has a time delay $td_1$ associated therewith of approximately 2 nsec. Filter 54 actually has a time delay of less than 19 nsec but in order to provide the necessary regenerative feedback for proper operation of the oscillating limiter, the delay through limiter 46, filter 54, switch 56 and delay line 94 must be modulo 2 Pi, i.e., a multiple of the inverse frequency (in radians). In this case the IF frequency of 70 MHz dictates that the delay be a multiple of 14.3 nsec. In the current implementation, transistor Q102 provides a phase inversion, hence, the required phase shift is modulo 2 Pi+Pi, i.e., an odd multiple of 7.14 nsec (approximately 21.4 nsec). This condition is not quite satisfied by the delays inherent in limiter 46, filter 54 and switch 56. In order to satisfy the condition, therefore, some delay must be added which is accomplished here with an approximate 0.8 nsec delay added by delay line 94. Hence, the total delay from output 50 of limiter 46 to input 44 via filter or feedback path 54 is referred to as the filter or feedback path delay of $td_2$.

Demodulator 52 and shaping circuit 60 will now be described. As mentioned, detector 52 is preferably a double-balanced phase detector driven by the outputs from the exclusive OR/NOR logic gate 82 of limiter 46. Input 92 of demodulator 52 is directly coupled via a first path 110 to a first input 112 of an exclusive OR/NOR logic gate 114 which is powered from power supply PS2. Input 90 is coupled through an odd multiple quarter wavelength delay line 116, such as a length of coaxial cable, to a second input 118 of gate 114. Preferably, delay line 116 is a three quarter wavelength delay line at 70 MHz. Input 118 of gate 114 is further coupled to ground through the series resistors R22 and R23. Resistor R22 terminates coaxial cable 63. To that end, the junction of resistors R22 and resistor R23 is coupled to ground through capacitor C10.

Exclusive OR output 120 and Exclusive NOR output 122 of gate 114 provide a balanced detector output. Outputs 120 and 122 are resistively coupled to ground through resistors R24 and R25, respectively. Outputs 120 and 122 are further coupled to the base of NPN transistors Q110 and Q112, respectively, through identical T-networks each comprised of resistor R26, capacitor C12, and inductor L10. Further, the base of each transistor Q110 and Q112 is capacitively coupled to the other through capacitor C13. The emitters of transistors Q110 and Q112 are resistively coupled through the series combination of resistors R28 and R29, the junction of which is resistively coupled to ground through resistor R30.

Gate 114 operates in conjunction with first path 110 and delay line 116 as a phase detector, the outputs of which drive the above components (comprising a low pass filter) to couple the video and audio and related signals to transistors Q110 and Q112. The cutoff frequency of this low pass filter is set sufficiently high (e.g., 18 MHz) whereby only the undesired detector outputs components at twice the IF frequency (hence at 140 MHz) are effected. The low pass filter thus has no significant effect on the baseband, which may extend to one-half the bandwidth of the widest IF filter 30, or 15 MHz.

The collector of transistor Q110 is directly coupled to the collector and base of a first PNP transistor Q114 and also to the bases of second and third PNP transistors Q115 and Q116, respectively, which function as current mirrors. Similarly, the collector of transistor Q112 is directly coupled to the collector and base of fourth PNP transistor Q117 and to the bases of fifth and sixth PNP transistors Q118 and Q119, respectively. The emitters of all six transistors Q114 through Q119 are resistively coupled to power supply PS1 by resistors R31 through R36, respectively.

The collectors of transistors Q116 and Q119 provide a differential video and audio output or baseband signal to the remaining circuitry (66) of FM receiver 10. The collectors of transistors Q115 and Q118 similarly provide a replica of that same differential video and audio output signal to drive phasing circuit 60. By provision of transistors Q116, 119 on the one hand, and transistors Q115, Q118 on the other, it is possible to provide a differential video output for the remaining circuitry 66 of FM receiver 10, and to drive phasing circuit 60 with identical differential video outputs while maintaining isolation between phasing circuit 60 and the remaining receiver circuitry 66.

With respect to the shaping circuit 60, one of the video outputs, the collector of transistor Q115, is directly coupled to the collector and the base of NPN transistor Q120 (which therefore is diode-configured) and further to the base of current mirror NPN transistor Q121. The other video output, the collector of transistor Q118, is directly coupled to the collector of transistor Q121 and to the video input 130 of filter 132. The emitters of transistors Q120 and Q121 are each resistively coupled to ground by resistors R38 and R40, respectively. This configuration results in a single-ended video or baseband signal on video input 130.

Filter 132 also has a DC input 134 which may be utilized to adjust the bias on the base of PNP transistor Q122 from output 135 of filter 132. As will be recognized, as the bias of transistor Q122 is varied, the center frequency of filter 54 will be tuned in response thereto. So that the center frequency of electrically tunable bandpass filter 54 can be manually adjusted at the factory to the nominal 70 MHz center frequency thereof for proper operation in the field, DC adjust circuit 136 is provided. Hence, absent offset, as will be discussed, the center frequency of electrically tunable bandpass filter 54 is approximately equal to the center frequency of the IF center frequency.

DC adjust circuit 136 is a variable DC power supply including variable voltage divider potentiometer R42, capacitor C15, resistor R43 and NPN transistor Q123. The emitter of transistor Q123 is resistively coupled to ground through resistor R43, and the base thereof capacitively coupled to ground through capacitor C15 and to variable voltage divider R42 through the wiper arm thereof. The collector of transistor Q123 is directly coupled to power supply PS1. By adjustment of the wiper arm of potentiometer R42, a DC output is provided on the emitter of transistor Q123. The operating point of electrically tunable bandpass filter 54 is responsive to transistor Q122 which is biased, in large measure, by the emitter output of transistor Q123 thus making the nominal operating point or center frequency of filter 54 dependent upon the setting of DC adjust circuit 136.

Transistor Q122 (and hence filter 54) is also responsive to filter 132 which is configured according to the principles of this invention. The emitter of transistor Q122 is coupled to power supply PS1 through resistor R44, and the collector thereof is coupled directly to ground. The emitter of transistor Q122 is further coupled to the input 64 of electrically tunable bandpass filter 54 for tuning purposes as will be described.

Filter 132 preferably provides an appropriate amount of phase lead $\phi_n$ to each frequency component $f_n$ of the baseband signal at video input 130 according to the formula $$\phi_n = 360° \cdot \frac{td_1 + td_2 + td_3}{\frac{1}{f_n}}.$$

Such a filter would thus require some form of broadband phase lead network. While this concept forms a basis for the present invention, such a broadband phase lead network is not always achievable, especially over as wide a band as 8 MHz, the television bandwidth, for example. However, if almost all the modulation "stress" on the system were concentrated at (or close to) one frequency, it then becomes practical to use conventional LRC phase lead networks to accomplish the desired phase lead as a spot approximation in the band of interest. Fortunately this is exactly the nature of a TV signal, as transmitted by satellite. The signal is pre-emphasized by some 13 dB between 187 KHz and 875 KHz (for NTSC; PAL and SECAM are similar), which reduced the deviation due to horizontal scanning to small proportions, and leaves only the chrominance signal at approximately 3.58 MHz as it's major, repetitive, high frequency component. While other high frequencies do certainly exist, they are generally the differentiated result of image edge contours, and thus occur with far less frequency than the chroma signal, which has continuous sidebands for all colored image areas. Since chroma exists for long periods, at high level, it is the major opportunity for detector mistracking, whose visible effect is what are knows as "sparklies". From the "stress" analysis, if we take the baseband output which is delayed by about 15 nsec ($td_1$ plus $td_3$), and advanced it's phase by 36 nsec, for a net advance of 21 nsec ($td_1$ plus $td_2$), then applied this signal to the feedback filter as a phase modulator, we should by appropriate vector summation and level adjustment able to produce a signal at the summing point with zero apparent envelope delay, relative to the input signal.

In fact, this is exactly the situation observed. An RL lead network (see FIG. 4 to be discussed infra) provides a significant improvement over the prior Baghdady circuitry alone, for the (chroma) modulation indices up to 3 encountered in satellite television FM transmission. Such a circuit would have a phase lead characteristic of approximately 45° at about 3.58 MHz. As mentioned, because the modulation stress is concentrated at this frequency, for most purposes, filter 132 may be designed to accommodate this dominant baseband component. On the other hand, many television signals include elaborate audio subcarrier modulation. Unless filter 132 also provides the appropriate phase lead $\phi_n$ to each of these subcarriers, it has been found that the composite energy due to these subcarriers may deleteriously affect operation of the oscillating limiter when they are supplied as modulation signals to the feedback filter 54. The oscillating limiter itself however, is generally sufficient to handle such subcarriers as they generally have a modulation index of less than one. Hence, because a filter to provide the appropriate $\phi_n$ at 3.58 MHz as well as for the subcarriers may not be practical, and because the oscillating limiter needs no assistance to handle them, it has been found possible to make filter 132 such that it provides the appropriate $\phi_n$ at 3.58 MHz without regard to other baseband components and which substantially attenuates the subcarriers. To this end, filter 132 is preferably comprised of potentiometer R50, inductor L15 and capacitors C20 and C22.

Potentiometer R50 is series coupled between DC adjust circuit 136 and the base of transistor Q122 to provide a DC feedthrough. Also, the DC signal from adjust circuit 136 may be varied over time due to the averaging affects of filter 132 on the video signals at input 130 to thereby vary the center frequency of filter 54 to compensate for offset, drift and the like. Video input 130 is coupled to the wiper arm of potentiometer R50 to thereby permit adjustment of the magnitude of the output of filter 132. The junction of potentiometer R50 and base of transistor Q122 is coupled to ground through the parallel combination of variable inductor L15 and capacitor C20 which are series connected to capacitor C22. Inductor L15 is adjustable to permit fine tuning of the phase of filter 132 to obtain the desired $\phi_n$ at about 3.58 MHz during assembly at the factor. Hence, capacitor C20 and inductor L15 generally provide the desired phase adjust whereas capacitor C22 cooperates with potiometer R50 to vary the DC signal from circuit 136.

Figure 4:
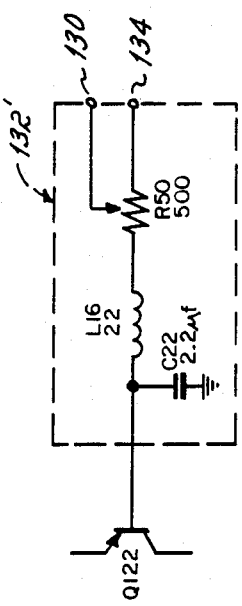
FIG. 4 is a schematic drawing of an alternative phasing circuit of FIG. 1.
Figure 3:
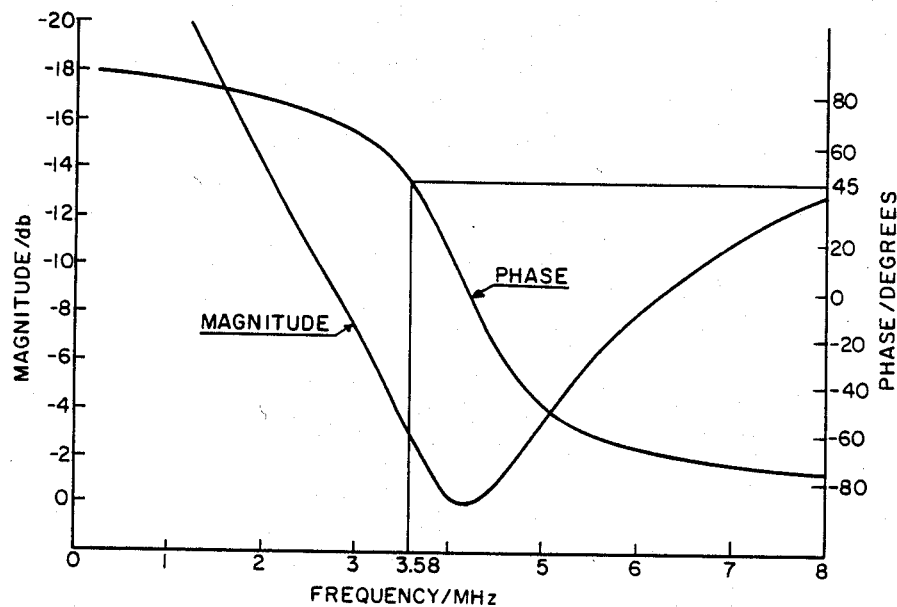
FIG. 3 is a graph of the amplitude and phase response of the phasing circuit of FIG. 2.
Figure 5:
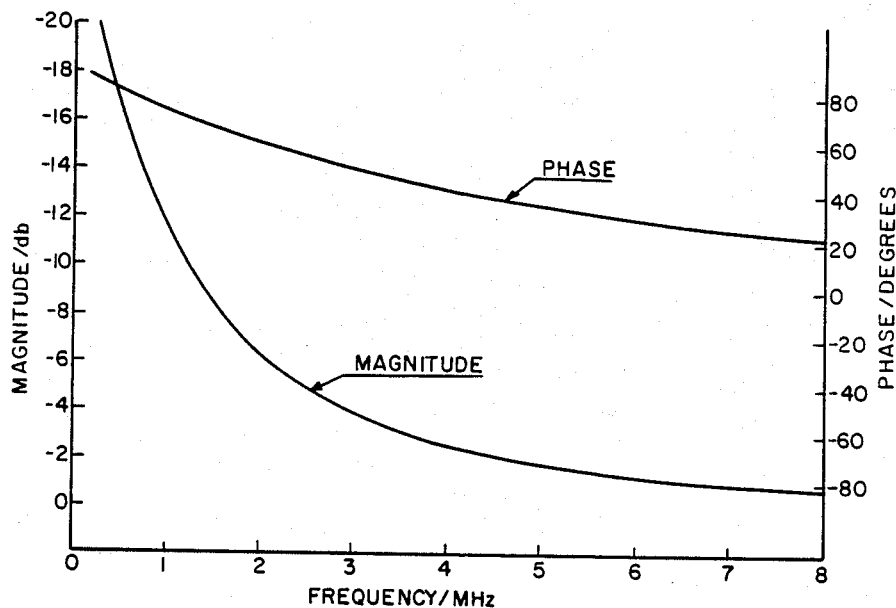
FIG. 5 a graph of the amplitude and phase response of the phasing circuit of FIG. 4.

As can be seen from FIG. 3, filter 132 provides approximately 45° phase lead at 3.58 MHz and goes resonant just above that frequency so that attenuation is provided at the subcarrier frequencies (5.4 to 8.5) MHz to thereby cut them off.

Where subcarriers are not significant, filter 132 may be the simpler RL circuit of FIG. 4 (Filter 132') with the aforesaid potentiometer R50 and capacitor C22. However, the parallel inductor L15 and capacitor C20 branch has been replaced with inductor L16 in series with potentiometer R50. Filter 132' similarly provides approximately 45° phase lead at 3.58 MHz (FIG. 5) but does not significantly attenuate subcarrier components of the baseband signal.

By virtue of the foregoing, filter 132 (or filter 132') provides control signals to phase modulate filter 54 according to a predetermined phase relationship. Filter 132 (and 132') also provides a DC control signal to vary the center frequency of filter 54 to compensate for offset, drift or the like.

The DC component or control signal from phasing circuit 60 is an integrated response to the varying frequency output from the demodulator 52 and thus represents a DC value reflective of the average or center frequency over time (which corresponds to the carrier frequency) as seen by the demodulator 52. Where that average frequency is offset from what is ideally expected, the DC voltage generated in filter 132 (actually a variation of the DC output of circuit 136) and passed proportionately through transistor Q122 will cause the center frequency of the electrically tunable bandpass filter 54 to move in a direction toward the actual center or carrier frequency of the FM signal (actually to the true center frequency of the IF signal if it is offset from the expected 70 MHz). Hence, frequency offsets due to improper operation of the satellite and/or fluctuations caused in the receiving circuitry such as at the reflector antenna are compensated in a manner analageous to automatic fine tuning as is well understood. By way of example, if the expected IF center frequency were 70 MHz, (fd) and the actual frequency is 70.1 MHz (f1), this would imply that the center frequency of the oscillating limiter should be tuned or offset by 0.1 MHz ($f_1 - f_d$) Over time, phasing circuit 60 would provide a DC control signal sufficiently offset from that to which the unit was nominally set as to affect the oscillating limiter center frequency by the appropriate amount. This adjustment, because it is derived from averaging the demodulated signals, does not track the modulation of the FM signal.

In operation, FM signals received on input 14 will be super-heterodyned to a 70 MHz IF signal and then filtered through one of two IF filters. The filtered IF signal will be amplified and the amplified IF signal processed by the oscillating limiter and demodulator to provide a baseband signal to the rest of the circuitry. The feedback filter of the oscillating limiter will function as a phase modulator, the modulating signals being the demodulated video chroma signal advanced by leading phase in a predetermined manner. The foregoing cooperate to improve the quality of the information signal resulting in improved picture quality.

Although not shown in the Figures, it is to be understood that the positive power supply lines should be bypassed to ground by several 0.01 microfarad capacitors as is well known. Further, the power supply lines should be provided with impedances comprised of a ferrite bead or the like surrounding each positive power supply line as is known to suppress electromagnetic interference.

All capacitances are in picofarads except those marked in microfarads and those indicated to be "0.01", the latter also being in microfarads. All inductances are given in microhenries and resistances in ohms. Finally, gates 74, 82 and 120 comprise an MC10H107P integrated ECL circuit manufactured by Motorola Semiconductor Products, Phoenix, Ariz.

While the invention has been described in connection with reception of satellite transmitted television signals, in its broader aspects, the invention is applicable to the reception of FM signals generally.

Having described the invention, what is claimed is:

1. A circuit for reducing noise in an FM signal modulated by a plurality of baseband signal components, each at a respective frequency $f_m$, comprising:
   a limiter having an input adapted to receive such an FM signal and an output, the limiter having a first time delay $td_1$;
   feedback means coupling the limiter output to the limiter input and responsive to control signals for phase modulating signals fed back therethrough by the control signals and for providing regenerative feedback around the limiter, the feedback means having a second time delay $td_2$;
   control means responsive to the limiter output for generating the control signals, the control means including first means having a third time delay $td_3$ for generating first signals corresponding to baseband signal components of a received FM signal, each at a respective frequency $f_n$, and second means advancing the phase of each of the first signals by a respective amount $\phi_n$ wherein $$\phi_n \text{ approximately equals } 360° \cdot \frac{td_1 + td_2 + td_3}{1/f_n}$$

for generating the control signals.

2. The circuit of claim 1 wherein $f_n = f_m$.

3. The circuit of claim 1, the feedback means including a bandpass filter having a center frequency, the second means further for generating a DC said control signal which is correlated to an average over time of the frequency of the first signals, the bandpass filter being responsive to the DC control signal whereby to electrically offset the center frequency by an amount approximately equal to $f_n - f_m$.

4. A circuit for reducing noise in an FM signal modulated by at least one dominant baseband signal component at a frequency $f_m$, comprising:
   a limiter having an input adapted to receive such an FM signal and an output, the limiter having a first time delay $td_1$;
   feedback means coupling the limiter output to the limiter input and responsive to a control signal for phase modulating signals fedback therethrough by the control signal and for providing regenerative feedback around the limiter, the feedback means having a second time delay $td_2$;
   control means responsive to the limiter output for generating the control signal, the control means including first means for having a third time delay $td_3$ for generating a first signal at a frequency $f_n$ and corresponding to a dominant baseband signal component of a received FM signal, and second means for advancing the phase of the first signal by an amount $\phi$ wherein $$\phi \text{ approximately equals } 360° \cdot \frac{td_1 + td_2 + td_3}{1/f_n}$$

for generating the control signal.

5. The circuit of claim 4 wherein $f_n = f_m$.

6. The circuit of claim 4, the feedback means including a bandpass filter having a center frequency, the second means further for generating a DC control signal which is correlated to an average over time of the frequency of the first signal, the bandpass filter being responsive to the DC control signal whereby to electrically offset the center frequency by an amount approximately equal to $f_n - f_m$.

7. The circuit of claim 4, the second means further for cutting-off any said first signal having a frequency much above $f_n$.

8. The circuit of claim 7 wherein $f_n = f_m$.

9. The circuit of claim 7, the feedback means including a bandpass filter having a center frequency, the second means further for generating a DC control signal which is correlated to an average over time of the frequency of the first signal, the bandpass filter being responsive to the DC control signal whereby to electrically offset the center frequency by an amount approximately equal to $f_n - f_m$.

10. The circuit of claim 4, wherein the FM signal is a television signal and the dominant signal component is at approximately 3.58 MHz.

11. The circuit of claim 10, $\phi$ approximately equal to 45°.

12. The circuit of claim 10, the second means further for cutting off any said first signal having a frequency above approximately 5.4 MHz.

13. A receiver adapted to receive FM signals modulated by a plurality of baseband signal components, each at a respective frequency $f_m$, and to demodulate the FM signals to generate signals corresponding to the baseband signal components, the receiver comprising:
first means for receiving such FM signals;
mixer means for mixing received FM signals with at least one local oscillator signal to generate intermediate frequency FM signals modulated by a plurality of baseband signal components, each at a respective frequency $f_m$;
a limiter having an input adapted to receive the intermediate frequency FM signals and an output, the limiter having a first time delay $td_1$;
feedback means coupling the limiter output to the limiter input and responsive to control signals for phase modulating signals fedback therethrough by the control signals and for providing regenerative feedback around the limiter, the feedback means having a second time delay $td_2$;
control means responsive to the limiter output for generating the control signals, the control means including first means having a third time delay $td_3$ for generating first signals corresponding to baseband signal components of a received FM signal, each at a respective frequency $f_n$, and second means advancing the phase of each of the first signals by a respective amount $\phi_n$ wherein $$\phi_n \text{ approximately equals } 360° \cdot \frac{td_1 + td_2 + td_3}{1/f_n}$$

for generating the control signals.

14. The circuit of claim 13 wherein $f_n = f_m$.

15. The circuit of claim 13, the feedback means including a bandpass filter having a center frequency, said second means further for generating a DC said control signal which is correlated to an average over time of the frequency of the first signals, the bandpass filter being responsive to the DC control signal whereby to electrically offset the center frequency by an amount approximately equal to $f_n - f_m$.

16. A receiver adapted to receive FM signals modulated by a plurality of baseband signal components, each at a frequency $f_m$, and to demodulate the FM signals to generate signals corresponding to the baseband signal components, one of the baseband signal components being dominant and at a frequency $f_d$, the receiver comprising:
first means for receiving such FM signals:
mixer means for mixing received FM signals with at least one local oscillator signal to generate intermediate frequency FM signals modulated by a plurality of baseband signal components, each at a respective frequency $f_m$ one dominant baseband signal component being at a frequency $f_d$;
a limiter having an input adapted to receive the intermediate frequency FM signal and an output, the limiter having a first time delay $td_1$;
feedback means coupling the limiter output to the limiter input and responsive to a control signal for phase modulating signals fedback therethrough by the control signal and for providing regenerative feedback around the limiter, the feedback means having a second time delay $td_2$;
control means responsive to the limiter output for generating the control signal, the control means including first means having a third time delay $td_3$ for generating a first signal at a frequency $f_1$ and corresponding to a dominant baseband signal component of a received FM signal, and second means for advancing the phase of the first signal by an amount $\phi$ wherein $$\phi \text{ approximately equals } 360° \cdot \frac{td_1 + td_2 + td_3}{1/f_1}$$

for generating the control signal.

17. The circuit of claim 16 wherein $f_1 = f_d$.

18. The circuit of claim 16, the feedback means including a bandpass filter having a center frequency, the second means further for generating a DC control signal which is correlated to an average over time of the frequency of at least the first signal, the bandpass filter being responsive to the DC control signal whereby to electrically offset the center frequency by an amount approximately equal to $f_1 - f_d$.

19. The circuit of claim 16, the second means further for cutting-off any said first signal having a frequency much above $f_1$.

20. The circuit of claim 17 wherein $f_1 = f_d$.

21. The circuit of claim 19, the feedback filter means including a bandpass filter having a center frequency, the second means further for generating a DC control signal which is correlated to an average over time of the frequency of at least the first signal, the bandpass filter being responsive to the DC control signal whereby to electrically offset the center frequency by an amount approximately equal to $f_1 - f_d$.

22. A method of reducing noise in an FM signal modulated by a plurality of baseband signal components, each at a respective frequency $f_n$, comprising:
(a) amplitude limiting the FM signal through a limiter;
(b) demodulating the FM signal to generate first signals corresponding to the baseband signal components, each at a respective frequency $f_n$;
(c) feeding back the amplitude limited FM signal through a feedback network to the limiter;
(d) phase modulating the feedback amplitude limited FM signal in the feedback network with the first signals each of which has been phase advanced by a respective amount $\phi_n$ wherein $\phi_n$ approximately equals 360° times the sum of any time delays in steps (a)–(c) divided by the inverse of the frequency $f_n$ of the said first signal.

23. A method of reducing noise in an FM signal modulated by at least one dominant signal component at a frequency $f_n$, comprising:
   (a) amplitude limiting the FM signal through a limiter;
   (b) demodulating the amplitude limited FM signal to generate a first signal corresponding to the dominant baseband signal component at a frequency $f_n$;
   (c) feeding back the amplitude limited FM signal through a feedback network to the limiter;
   (d) phase modulating the feedback amplitude limited FM signal in the feedback network with the first signal which has been phase advanced by a respective amount $\phi$ wherein $\phi$ approximately equals 360° times the sum of any time delays in steps (a)–(c) divided by the inverse of the frequency $f_n$ of the first signal.

24. A circuit for reducing noise in an FM television signal modulated by at least a chroma signal component at a frequency $f_n$, comprising:
   a limiter having an input adapted to receive such an FM television signal, and an output, the limiter having a first time relay $td_1$;
   feedback means coupling the limiter output to the limiter input and responsive to a control signal for phase modulating signals feedback therethrough by the control signal and for providing regenerative feedback around the limiter, the feedback means having a second time delay $td_2$;
   control means responsive to the limiter output for generating the control signal, the control means including first means having a third time delay $td_3$ for generating at least a first signal at a frequency $f_n$ and corresponding to a chroma signal component of a received FM television signal, and second means for advancing the phase of the first signal by an amount $\phi$ wherein $$\phi \text{ approximately equals } 360° \cdot \frac{td_1 + td_2 + td_3}{1/f_n}$$

for generating the control signal.

25. The circuit of claim 24, the second means further for cutting-off any signal generated by said first means having a frequency much above $f_n$.

26. A method of reducing noise in an FM television signal modulated by at least a chroma signal component at a frequency $f_n$, comprising:
   (a) amplitude limiting the FM television signal through a limiter;
   (b) demodulating the amplitude limited FM television signal to generate at least a first signal corresponding to the chroma signal component at a frequency $f_n$;
   (c) feeding back the amplitude limited FM signal through a feedback network to the limiter;
   (d) phase modulating the feedback amplitude limited FM signal in the feedback network with the first signal which has been phase advanced by a respective amount $\phi$ wherein $\phi$ approximately equals 360° times the sum of any time delays in steps (a)–(c) divided by the inverse of the frequency $f_n$ of the first signal.

27. The method of claim 26 further comprising:
   (e) cutting-off from reaching the feedback network signals generated at a frequency much above $f_n$ by said demodulating.

* * * * *

UNITED STATES PATENT AND TRADEMARK OFFICE
CERTIFICATE OF CORRECTION

PATENT NO. : 4,731,872
DATED : March 15, 1988
INVENTOR(S) : Clyde Washburn Jr.

It is certified that error appears in the above-identified patent and that said Letters Patent is hereby corrected as shown below:

Column 10, line 46, "119" should be -- Q119 -- .

Column 13, line 33, after "$(f_1-f_d)$" add -- . -- .

Column 16, line 61, before "FM" add -- amplitude limited -- .

Column 17, line 27, "relay" should be -- delay -- .

Column 17, line 30, "feedback" should be -- fedback -- .

Signed and Sealed this

Twenty-seventh Day of September, 1988

Attest:

DONALD J. QUIGG

Attesting Officer     Commissioner of Patents and Trademarks